(12) United States Patent
Visweswariah et al.

(10) Patent No.: US 7,873,925 B2
(45) Date of Patent: *Jan. 18, 2011

(54) METHOD AND APPARATUS FOR COMPUTING TEST MARGINS FOR AT-SPEED TESTING

(75) Inventors: Chandramouli Visweswariah, Croton-on-Hudson, NY (US); Jinjun Xiong, White Plains, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 413 days.

This patent is subject to a terminal disclaimer.

(21) Appl. No.: 12/013,925

(22) Filed: Jan. 14, 2008

(65) Prior Publication Data

US 2009/0182522 A1    Jul. 16, 2009

(51) Int. Cl.
*G06F 17/50* (2006.01)

(52) U.S. Cl. .................. 716/4; 716/5; 716/6; 714/745; 702/89; 702/125

(58) Field of Classification Search .............. 716/4–6; 714/745; 702/89, 125
See application file for complete search history.

(56) References Cited

U.S. PATENT DOCUMENTS

| 7,539,893 | B1* | 5/2009 | Ferguson ..................... 714/6 |
| 7,620,921 | B2* | 11/2009 | Foreman et al. ............. 716/6 |
| 2008/0010032 | A1* | 1/2008 | Sugiyama .................. 702/75 |
| 2009/0119629 | A1* | 5/2009 | Grise et al. ................. 716/6 |

* cited by examiner

*Primary Examiner*—Nghia M Doan

(57) ABSTRACT

In one embodiment, the invention is a method and apparatus for computing margins for at-speed testing of integrated circuit chips. One embodiment of a method for computing a margin for at-speed testing of an integrated circuit chip design includes computing a statistical chip slack for the chip, computing a statistical test slack for the chip, and computing the margin from the chip slack and the test slack.

17 Claims, 6 Drawing Sheets

METHOD AND APPARATUS FOR COMPUTING TEST MARGINS FOR AT-SPEED TESTING

BACKGROUND OF THE INVENTION

The present invention relates generally to design automation, and relates more particularly to at-speed testing of integrated circuit chips.

When integrated circuit chips come off the manufacturing line, the chips are tested "at-speed" to ensure that they perform correctly. In particular, the chips are tested at a higher speed (smaller clock period) than is required for field operation in order to compensate for effects such as insufficient coverage, conditions, aging, coupling noise, and the like. For example, if the frequency required for field operation is 500 MHz, the chips may be tested at 550 MHz. This difference in frequency implies a corresponding difference in clock period, which is referred to as a testing "margin" or "slack." Selection of the margin plays an important role in improving or maximizing chip yield while maintaining product quality; however, conventional methods for selecting the margin are typically ad hoc and imprecise, often causing good chips to be discarded and/or bad chips to be put into circulation (i.e., used in a system or shipped to a customer).

Thus, there is a need in the art for a method and apparatus for computing test margins for at-speed testing.

SUMMARY OF THE INVENTION

In one embodiment, the invention is a method and apparatus for computing margins for at-speed testing of integrated circuit chips. One embodiment of a method for computing a margin for at-speed testing of an integrated circuit chip design includes computing a statistical chip slack for the chip, computing a statistical test slack for the chip, and computing the margin from the chip slack and the test slack.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for computing margins for at-speed testing of integrated circuit chips. Embodiments of the present invention compute test margins in a manner that maximizes or improves chip yield while minimizing or limiting product loss due to poor quality. Typically, there is a tradeoff in balancing these goals. Select too large a margin, and good chips may be discarded (although passing chips will be good quality); select too small a margin, and low quality chips may be put into use (although fewer chips will be discarded).

Within the context of the present invention, "yield" refers to the fraction of chips that are shipped (i.e., put into circulation) out of a group of manufactured chips. "Shipped Product Quality Loss" (or SPQL) refers to the fraction of shipped chips that are faulty. Thus, as discussed above, the goal of selecting a test margin is to maximize yield (i.e., fraction of chips put into circulation) such that SPQL is within a required threshold (e.g., one tenth of one percent).

Figure 1:
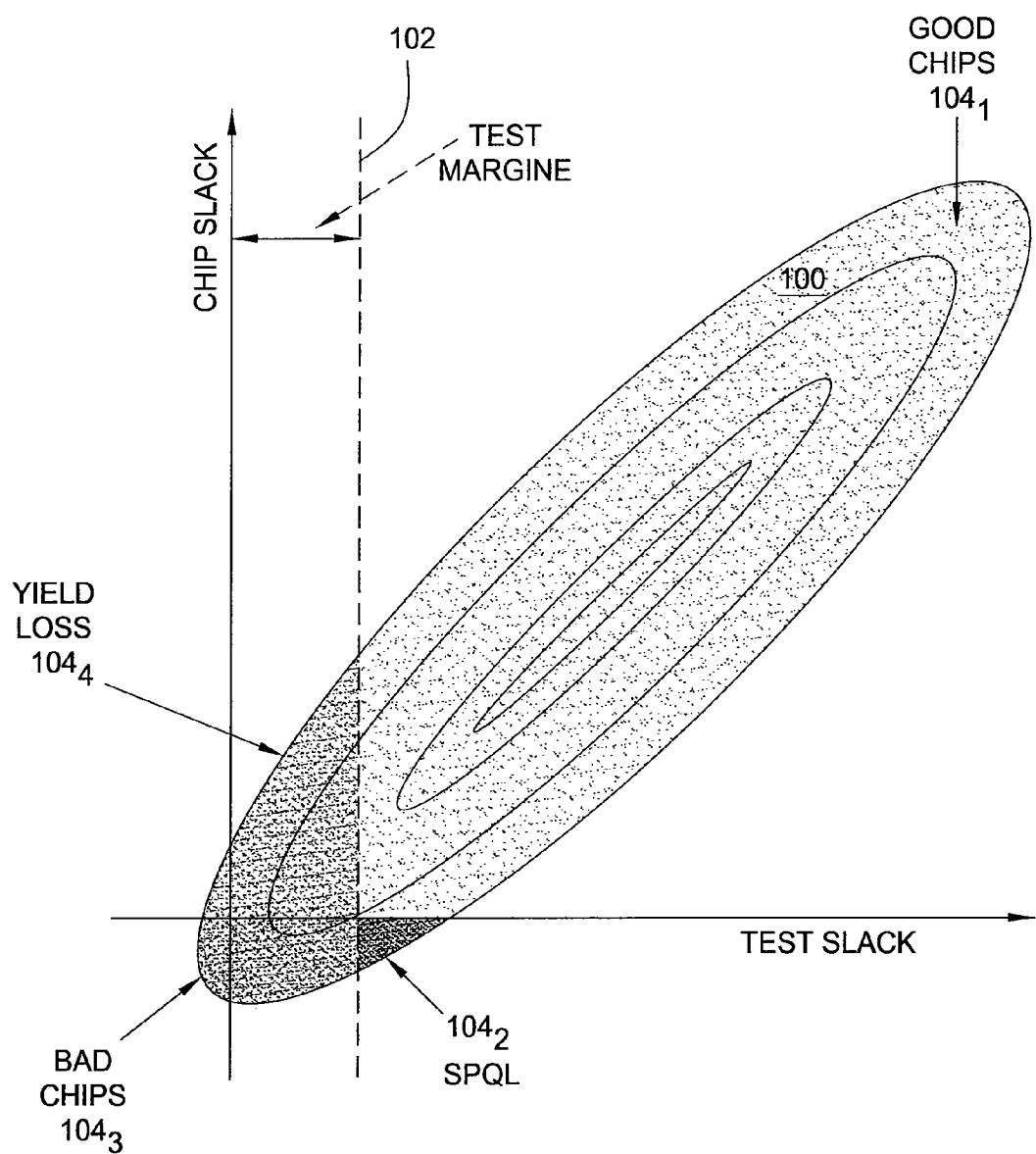
FIG. 1 is a graph illustrating the joint probability distribution of chip slack and test slack for an exemplary chip design.

FIG. 1 is a graph illustrating the joint probability distribution of chip slack and test slack for a batch 100 of manufactured chips of an exemplary chip design. The graph also illustrates some of the terminology associated with the present invention. Chip slack is the statistical distribution of the performance of the chip, represented as a timing slack. A positive chip slack implies that the chip can operate faster than required in the specifications, and a negative chip slack implies that the ship can only operate slower than required. Test slack is the statistical distribution of the performance of the tested portion of the chip, represented as a timing slack. Both chip slack and test slack are statistical due to inevitable manufacturing, environmental, and aging variations. The ovals in FIG. 1 represent contours of equal probability.

As illustrated, the gap between the test slack=0 axis (i.e., the y axis) and the dashed vertical line 102 represents the test margin. The test margin is the additional timing performance demanded of the tester in order to ensure the quality of the chips put into circulation. The line 102 and the chip slack=0 axis (i.e., the x axis) divide the graph into four quadrants $104_1$-$104_4$ (hereinafter collectively referred to as "quadrants 104"). The first quadrant, $104_1$, represents "good shipped" chips (i.e., the portion of the batch 100 of chips for which the chip slack is positive and the test slack is at least as high as the test margin (i.e., test slack falls to the right of the line 102)). The chips falling into the first quadrant, $104_1$, will be put into circulation and will operate as intended. The probability-weighted area of the first quadrant, $104_1$, is the fraction of good shipped chips in the batch 100.

The second quadrant, $104_2$, represents SPQL (i.e., the portion of the batch 100 of chips for which the chip slack is less than zero, but the test slack is at least as high as the test margin (i.e., test slack falls to the right of the line 102)). The chips falling into the second quadrant, $104_2$, will be put into circulation, but will not operate as intended and may be returned due to failure. The probability-weighted area of the second quadrant, $104_2$, is the SPQL in the batch 100.

The third quadrant, $104_3$, represents "bad" chips (i.e., the portion of the batch 100 of chips for which the chip slack is less than zero and the test slack is lower than the test margin (i.e., to the left of the line 102)). The chips falling into the third quadrant, $104_3$, will not be put into circulation, but will be discarded instead. The probability-weighted area of the third quadrant, $104_3$, is the fraction of discarded chips in the batch 100.

The fourth quadrant, $104_4$, represents yield loss (i.e., the portion of the batch 100 of chips for which the chip slack is positive, but the test slack is lower than the test margin (i.e., the test slack falls to the left of the line 102)). The chips falling into the fourth quadrant, $104_4$, are actually "good" chips in the sense that they perform as intended at field operation speed, and yet these chips will not be put into circulation because they fail at the test speed. The probability-weighted area of the fourth quadrant, $104_4$, is the unnecessary yield loss in the batch 100.

The effects of the test margin on the four quadrants 104 may be observed by moving the line 102 along the test slack axis (i.e., to vary the test margin). If the line 102 is moved to the left (i.e., decreasing the test margin), the yield loss is decreased (i.e., the fourth quadrant, $104_4$, is shrunk), but the SPQL is increased (i.e., the second quadrant, $104_2$, is enlarged). Alternatively, if the line 102 is moved to the right (i.e., increasing the test margin), the yield loss is increased (i.e., the fourth quadrant, $104_4$, is enlarged), but the SPQL is decreased (i.e., the second quadrant, $104_2$, is shrunk). Thus, FIG. 1 illustrates the tradeoff between yield and quality.

Figure 2:
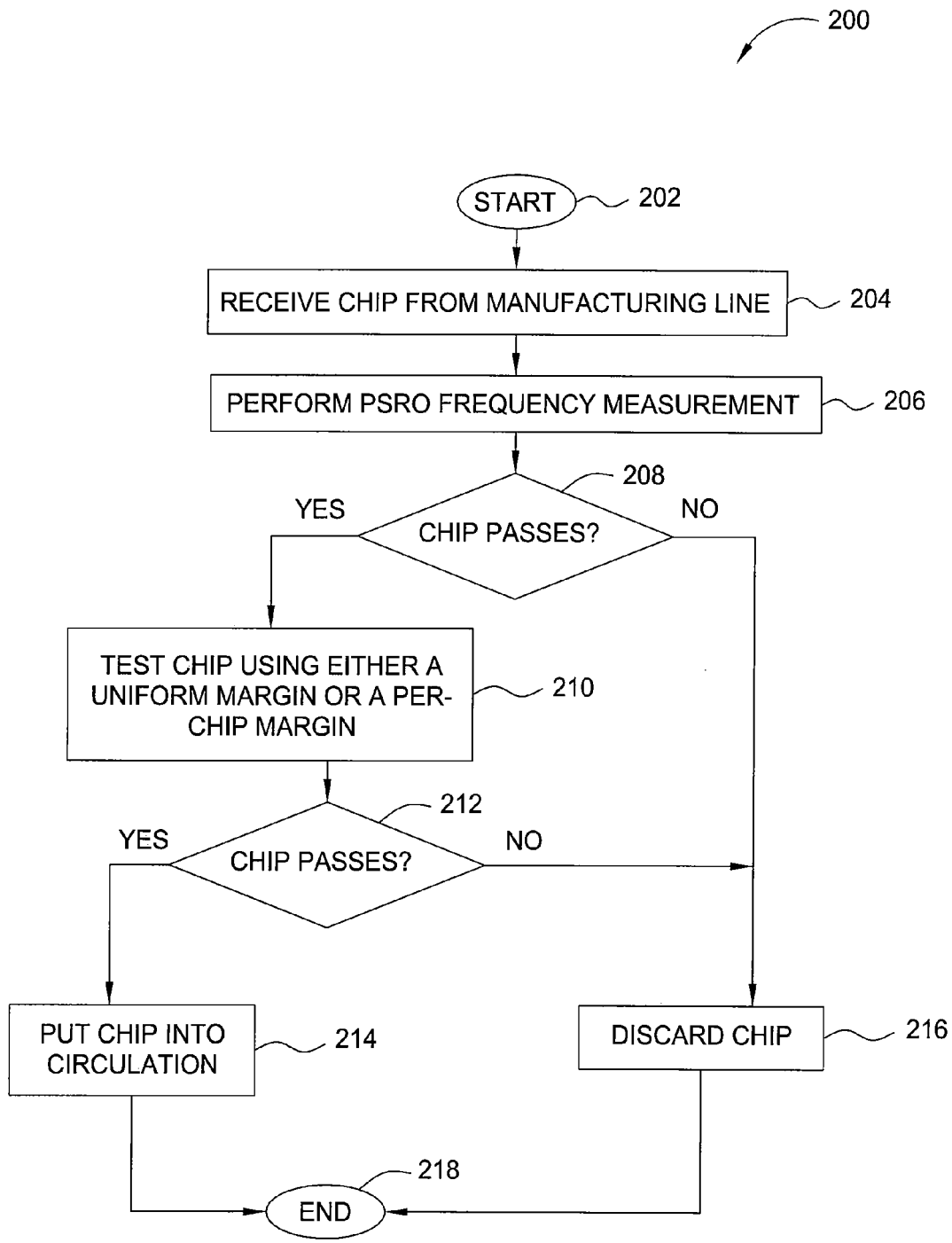
FIG. 2 is a flow diagram illustrating a first embodiment of a method for computing test margins, according to the present invention.

FIG. 2 is a flow diagram illustrating a first embodiment of a method 200 for computing test margins, according to the present invention. The method 200 may be implemented, for example, in order to compute an improved or optimal test margin for at-speed testing of integrated circuit chips.

The method 200 is initialized at step 202 and proceeds to step 204, where the method 200 receives a chip from the manufacturing line. The method 200 then proceeds to step 206 and performs a performance-sensitive ring oscillator (PSRO) frequency measurement of the chip. PSRO measurement is a quick and effective way to screen out chips with parametric defects. Those skilled in the art will appreciate that while ring oscillators are commonly used in practice, any test structure or screening circuit can be utilized in accordance with step 206. The results of the PSRO measurement are then stored on-chip in an electronic chip ID (ECID) macro or off-chip in a computer database.

In step 208, the method 200 determines whether the chip has passed the PSRO measurement screening criteria. If the method 200 concludes in step 208 that the chip has not passed PSRO measurement screening criteria, the method 200 discards the chip in step 216 before terminating in step 218.

Alternatively, if the method 200 concludes in step 208 that the chip has passed PSRO measurement screening criteria, the method 200 proceeds to step 210 and performs at-speed testing of the chip. In one embodiment, at-speed testing of the chip uses either a uniform margin or a per-chip margin. A uniform margin is fixed a margin that is used for all chips. In one embodiment, a uniform margin is either conservative or optimal. Embodiments of methods for at-speed testing using uniform margins are discussed in greater detail with respect to FIGS. 3 and 4. A per-chip margin is an optimal margin that is determined on a chip-by-chip basis. In one embodiment, an optimal per-chip margin is determined in accordance with PSRO measurement information. One embodiment of a method for at-speed testing using per-chip margins is discussed in greater detail with respect to FIG. 5.

In step 212, the method 200 determines whether the chip has passed the at-speed testing. If the method 200 concludes in step 212 that the chip has not passed at-speed testing, the method 200 discards the chip in step 216 before terminating in step 218.

Alternatively, if the method 200 concludes in step 212 that the chip has passed at-speed testing, the method 200 proceeds to step 214 and puts the chip into circulation (i.e., the chip is part of the useful yield of the respective batch and is used in a system or shipped to a customer) before terminating in step 218.

Figure 3:
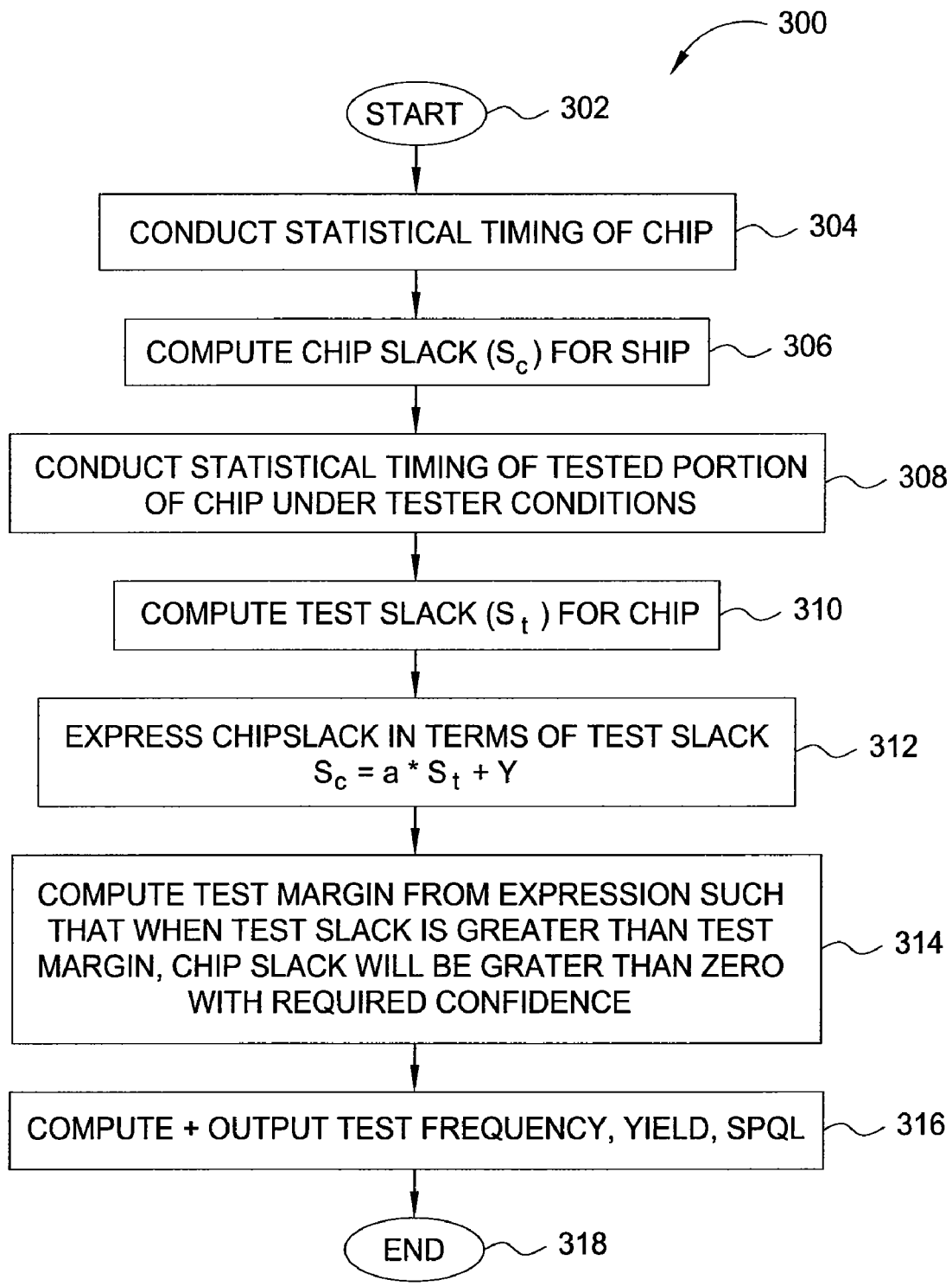
FIG. 3 is a flow diagram illustrating a second embodiment of a method for computing test margins, according to the present invention.

FIG. 3 is a flow diagram illustrating a second embodiment of a method 300 for computing test margins, according to the present invention. Specifically, the method 300 is a method for computing a conservative uniform test margin. The computed test margin is "conservative" in that it is larger than may be required (i.e., errs on the side of caution with respect to selecting chips to put into circulation). The computed test margin is "uniform" in that is applied to all chips to be tested.

The method 300 is initialized at step 302 and proceeds to step 304, where the method 300 conducts statistical timing of a chip to be tested. In one embodiment, the chip is timed at the required frequency according to the specification of the chip design. In step 304, statistical timing is conducted under use conditions in the field (i.e., ambient temperature, power supply voltage, and aging conditions which will be encountered in the field). In step 306, the method 300 computes the statistical chip slack ($S_c$) for the chip from the statistical timing results. The chip slack, $S_c$, represents the distribution of the difference between the required clock cycle time and the actual achieved clock cycle time. The computed chip slack, $S_c$, is typically a probability distribution in parameterized form.

In step 308, the method 300 conducts statistical timing of the tested portion of the chip. In step 308, the statistical timing is conducted under test chamber conditions (i.e., ambient temperature, power supply voltage, and aging conditions will be encountered in the test chamber). The method 300 then proceeds to step 310 and computes the statistical test slack ($S_t$) for the chip from the statistical timing results. The test slack, $S_t$, represents the distribution of the difference between the required clock cycle time and the actual achieved clock cycle on the tester. The computed test slack, $S_t$, is typically a probability distribution in parameterized form.

In step 312, the method 300 expresses the chip slack, $S_c$, in terms of the test slack, $S_t$. In one embodiment, the chip slack, $S_c$, is decomposed into correlated and independent components as:

$$S_c = a * S_t + Y \qquad \text{(EQN. 1)}$$

where $a*S_t$ is correlated with the chip slack, $S_c$, a is a constant, and $Y=N(y_0,\sigma_y^2)$ is a Gaussian statistical residue independent of the test slack, $S_t$. Assuming a linear canonical form for statistical timing quantities, the chip slack, $S_c$, and the test slack, $S_t$, can be written as:

$$S_c = c_0 + \sum_{i=0}^{n} c_i \Delta X_i + c_R \Delta X_c \qquad \text{(EQN. 2)}$$

$$S_t = t_0 + \sum_{i=0}^{n} t_i \Delta X_i + t_R \Delta X_t \qquad \text{(EQN. 3)}$$

In EQNs. 2 and 3, $c_0$ and $t_0$ are nominal or mean values, $c_i$ and $t_i$ are sensitivities to global sources of variation $\Delta X_i$ represented as unit Gaussian random variables, $c_R$ and $t_R$ are sensitivities to independently random variation, and $\Delta X_c$ and $\Delta X_t$ are independent unit Gaussian random variables. In this situation, the decomposition can be achieved by the following:

$$S_c = a * S_t + y_0 + \sum_{i=1}^{n} y_i \Delta X_i + y_R \Delta X_y \qquad \text{(EQN. 4)}$$

-continued $$a = \frac{\text{cov}(S_c, S_t)}{\sigma_t^2} = \frac{\sum_{i=0}^{n} c_i t_i}{\sum_{i=0}^{n} t_i^2 + t_R^2} \quad \text{(EQN. 5)}$$

$$\sigma_C^2 = a^2 \sigma_t^2 + \sigma_y^2 \text{ so } \sigma_y^2 = \sigma_C^2 - a^2 \sigma_t^2 \quad \text{(EQN. 6)}$$

$$c_0 = a t_0 + y_0 \text{ so } y_0 = c_0 - a t_0 \quad \text{(EQN. 7)}$$

Thus, EQN. 5 gives the value of a, EQN. 6 gives the variance of Y, and EQN. 7 gives the mean value of Y.

The method 300 then proceeds to step 314 and computes a test margin, $s_t$, such that when the test slack, $S_t$, is greater than the test margin, $s_t$, the chip slack, $S_c$, will be greater than zero with a required confidence (i.e., quality level). That is, the test margin, $s_t$, is computed such that $P(S_c<0|S_t>s_t)<q$ (where q represents a required quality level). This simple conditional probability can be solved analytically. For instance, replacing with EQN. 1 gives:

$$P(a^*S_t+Y<0|S_t>s_t)<P(a^*s_t+Y<0|S_t>s_t)=P(a^*s_t+Y<0)=P(Y<-a^*s_t)=q \quad \text{(EQN. 8)}$$

In one embodiment, the test margin, $s_t$, is computed as:

$$s_t = -F^{-1}(Y, q)/a \quad \text{(EQN. 9)}$$

by inverting Gaussian cumulative distribution function (CDF), F, i.e., the CDF of random variable Y whose mean and variance are known from EQN. 7 and EQN. 6, respectively.

The method 300 then computes and outputs the test frequency, expected yield, and expected SPQL in step 316 before terminating in step 318.

Figure 4:
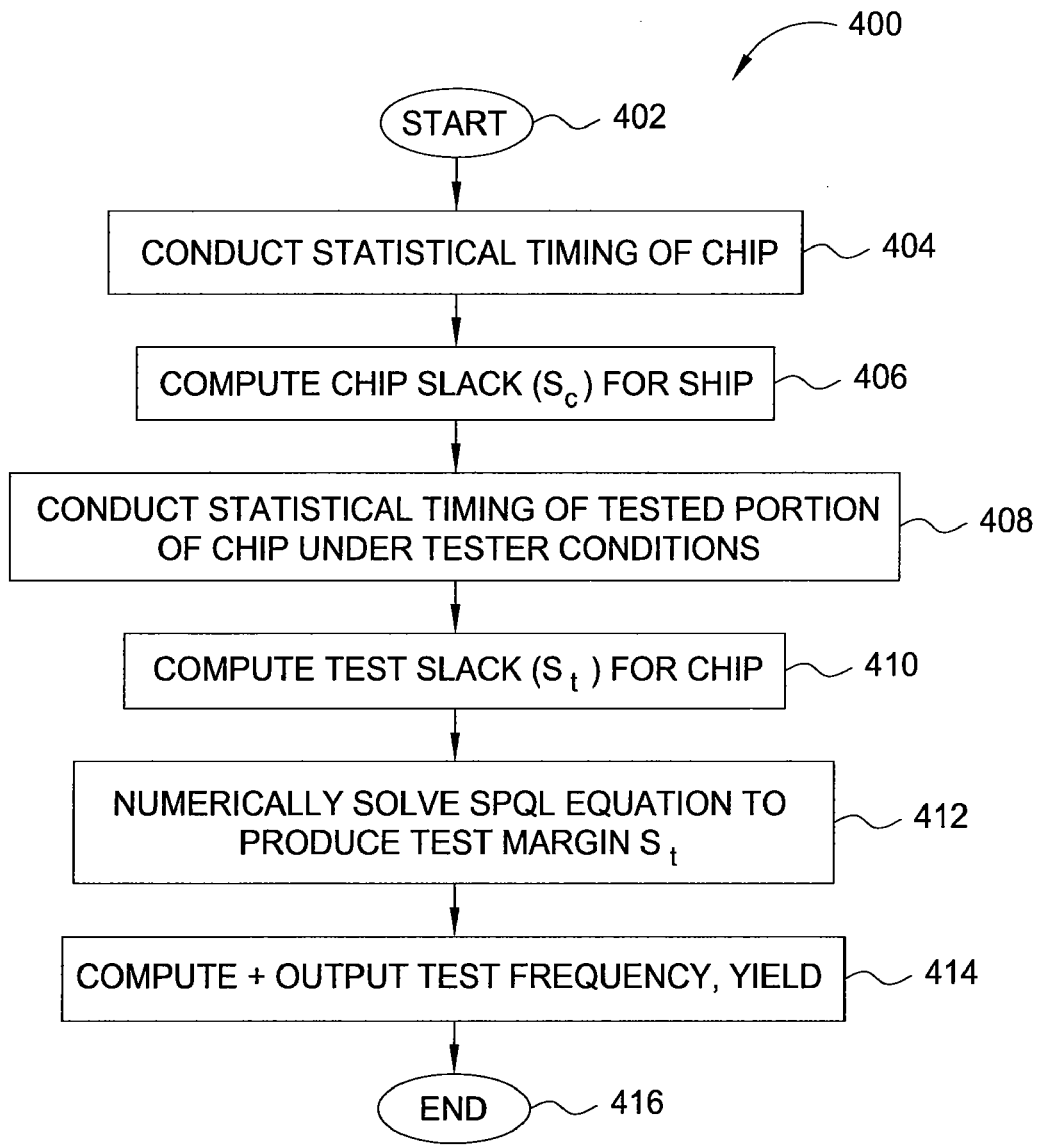
FIG. 4 is a flow diagram illustrating a third embodiment of a method for computing test margins, according to the present invention.

FIG. 4 is a flow diagram illustrating a third embodiment of a method 400 for computing test margins, according to the present invention. Specifically, the method 400 is a method for computing an optimal uniform test margin. Like the test margin computed by the method 300, the computed test margin is "uniform" in that it is applied to all chips to be tested. However, the method 400 is more aggressive than the "conservative" approach of the method 300, and aims for a test margin that allows for greater yield while maintaining chip quality.

The method 400 is initialized at step 402 and proceeds to step 404, where the method 400 conducts statistical timing of a chip to be tested. In one embodiment, the chip is timed at the required frequency according to the specifications of the chip design. In step 404, statistical timing is conducted under use conditions in the field (i.e., ambient temperature, power supply voltage, and aging conditions which will be encountered in the field). In step 406, the method 400 computes the statistical chip slack ($S_c$) for the chip from the statistical timing results. The chip slack, $S_c$, represents the distribution of the difference between the required clock cycle time and the actual achieved clock cycle time. The computed chip slack, $S_c$, is typically a probability distribution in parameterized form.

In step 408, the method 400 conducts statistical timing of the tested portion of the chip. In step 408, the statistical timing is conducted under test chamber conditions (i.e., ambient temperature, power supply voltage, and aging conditions will be encountered in the test chamber). The method 400 then proceeds to step 410 and computes the statistical test slack ($S_t$) for the chip from the statistical timing results. The test slack, $S_t$, represents the distribution of the difference between the required clock cycle time and the actual achieved clock cycle time on the tester. The computed test slack, $S_t$, is typically a probability distribution in parameterized form.

In step 412, the method 400 solves an optimization problem to compute the optimal test margin. SPQL can be written as a conditional probability as follows:

$$P(\text{bad} | \text{ship}) = \frac{P(\text{bad chip to be shipped})}{P(\text{shipping a chip})} \le q \quad \text{(EQN. 10)}$$

The goal of the optimization step 412 to maximize P(shipping a chip) such that P(bad|ship) is less than the required quality level, q. P(shipping a chip) is a monotone function of the test margin, $s_t$ (i.e., the higher the test margin, the lower P(shipping a chip) is). P(bad|ship) is also a monotone function of the test margin, $s_t$ (i.e., there is only one test margin value at which P(bad|ship) equals the required quality level). The maximization problem thus reduces to that of solving an equality:

$$P(\text{bad} | \text{ship}) = \frac{P(S_c<0, S_t>s_t)}{P(S_t>s_t)} \quad \text{(EQN. 11)}$$

$$= \frac{\int_{s_t}^{+\infty} \int_{-\infty}^{0} p(S_c, S_t) dS_c dS_t}{\int_{s_t}^{+\infty} p(S_t) dS_t}$$

$$= q$$

which is easily solvable to obtain the single unknown (i.e., the test margin, $s_t$). The numerator and the denominator can be expressed as erf functions in terms of the test margin, $s_t$, which aids in the solution.

In step 414, the method 400 computes and outputs the test frequency and yield. The method 400 then terminates in step 416.

Figure 5:
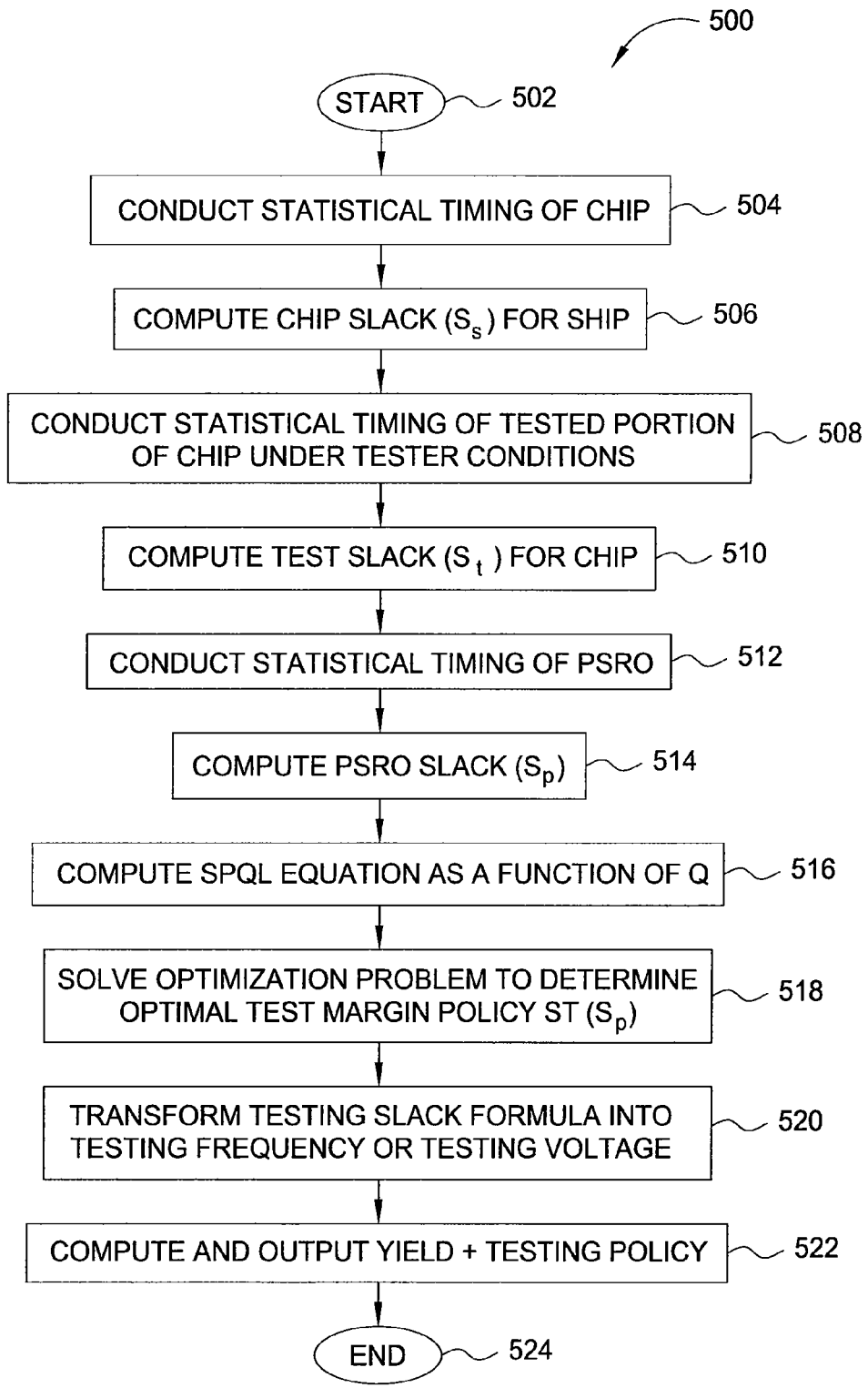
FIG. 5 is a flow diagram illustrating a fourth embodiment of a method for computing test margins, according to the present invention.

FIG. 5 is a flow diagram illustrating a fourth embodiment of a method 500 for computing test margins, according to the present invention. Specifically, the method 500 is a method for an optimal per-chip test margin. The method 500 leverages the fact that the PSRO for a given chip is already known prior to at-speed testing in order to improve yield. To this end, the method 500 seeks to maximize the number of chips put into circulation such that SPQL constraints are met, conditional upon known per-chip PSRO measurements.

The method 500 is initialized at step 502 and proceeds to step 504, where the method 500 conducts statistical timing of a chip to be tested. In one embodiment, the chip is timed with the required frequency according to the specifications of the chip design. In step 504, statistical timing is conducted under use conditions in the field (i.e., ambient temperature, power supply voltage, and aging conditions that will be encountered in the field). In step 506, the method 500 computes the statistical chip slack ($S_c$) for the chip from the statistical timing results. The chip slack, $S_c$, represents the distribution of the difference between the required clock cycle time and the actual achieved clock cycle time. The computed chip slack, $S_c$, is typically a probability distribution in parameterized form.

In step 508, the method 500 conducts statistical timing of the tested portion of the chip. In step 508, the statistical timing is conducted under test chamber conditions (i.e., ambient temperature, power supply voltage, and aging conditions will be encountered in the test chamber). The method 500 then proceeds to step 510 and computes the statistical test slack ($S_t$) for the chip from the statistical timing results. The test slack, $S_t$, represents the distribution of the difference between the required clock cycle time and the actual achieved clock cycle time on the tester. The computed test slack, $S_t$, is typically a probability distribution in parameterized form.

In step 512, the method 500 conducts statistical timing of the PSRO of the chip. The method 500 then proceeds to step 514 and computes the statistical PSRO slack ($S_P$) from the statistical timing results.

In step 516, the method 500 represents test margin as a function of measured PSRO slack (i.e., $s_t(SP)$). The goal is to compute this function or policy, which will convert a PSRO measurement on a particular chip into a test margin specific to that chip. This conditional probability optimization becomes a problem of functional calculus as follows:

$$\max P(\text{ship}) = \int_{-\infty}^{+\infty} p(S_t < s_t(S_P), S_P) dS_P \quad \text{(EQN. 12)}$$

such that (EQN. 13)

$$P(\text{bad} \mid \text{ship}) = \frac{\int_{-\infty}^{+\infty} p(S_c < 0, S_t > s_t(S_P), S_P) dS_P}{\int_{-\infty}^{+\infty} p(S_t > s_t(S_P), S_P) dS_P}$$

$$= \frac{\int_{-\infty}^{+\infty} \int_{s_t(S_P)}^{+\infty} \int_{-\infty}^{0} p(S_c, S_t, S_P) dS_c dS_t dS_P}{\int_{-\infty}^{+\infty} \int_{s_t(S_P)}^{+\infty} p(S_t, S_P) dS_t dS_P}$$

$$= q$$

For different PSRO slacks, $S_P$, the test margin, $s_t$, will be different. For instance, the test margin, $s_t$, can be less than, equal to, or greater than zero to ensure the required quality level, q, depending on the PSRO slack, $S_P$. From EQN. 13, the task becomes computing the test policy, $s_t(S_P)$, to maximize the percentage of chips put into circulation (i.e., P(ship)) such that P(bad|ship) equals the required quality level, q.

In one embodiment, EQN. 13 is solved by a Lagrange multiplier method that transforms the constrained optimization problem into an unconstrained optimization problem. In one embodiment, this transformation becomes:

$$\max \int_{-\infty}^{+\infty} \int_{s_t(S_P)}^{+\infty} \left( \lambda \left( \int_{-\infty}^{0} (S_c, S_t, S_P) dS_c - \right) \atop qp(S_t, S_P) \right) dS_t dS_P \quad \text{(EQN. 14)}$$

The equation for $s_t(S_P, \lambda)$ can be obtained by computing the functional derivative as:

$$-(1 + \lambda q) p(s_t(S_P), S_P) + \lambda \int_{-\infty}^{0} p(S_c, s_t(S_P), S_P) dS_c = 0 \quad \text{(EQN. 15)}$$

The optimal test margin, $s_t(S_P)$, can be shown to be a linear function of the PSRO slack, $S_P$:

$$s_t(S_P) = \mu_t - \frac{\mu_c}{\alpha} + \frac{\beta}{\alpha}(\mu_P - S_P) - \frac{\hat{\sigma}_c}{\alpha} \Phi^{-1}\left(q + \frac{1}{\lambda}\right) \quad \text{(EQN. 16)}$$

where $\mu_t$, $\mu_P$, $\sigma_c$, $\alpha$, and $\beta$ are computable from chip, PSRO, and test slacks. Thus, the only unknown term is an additive term depending on $Q = q + 1/\lambda$.

In step 518, the method 500 solves the optimization problem. Specifically, the method 500 computes the parameter, Q, from the SPQL equation. In one embodiment, step 518 involves inserting $s_t(S_P, \lambda)$ into the SPQL equation to produce SPQL(Q)=q. This can be solved numerically to determine the optimal parameter, Q. From this, the optimal test margin policy can be computed:

$$s_t = s_t(S_P) \quad \text{(EQN. 17)}$$

In step 520, the method 500 transforms the test margin formula (i.e., EQN. 17) into the equation for testing frequency or the equation for testing voltage. These equations may be written, respectively, as:

$$f_t = f_t(S_P) \quad \text{(EQN. 18)}$$

$$V_t = V_t(S_P) \quad \text{(EQN. 19)}$$

Thus, the per-chip test margin can be applied on the tester in different ways. In one embodiment, the tester adjusts the testing frequency for each chip in order to apply the required per-chip test margin. In another embodiment, the tester derates the power supply voltage appropriately on a per-chip basis to achieve the same objective. A higher test margin is equivalent to testing at the same test margin, but at a lower power supply voltage. The tester can thus be programmed appropriately to apply the required test margin that is specifically computed for each chip.

The method 500 then proceeds to step 522 and computes and outputs the optimal yield corresponding to the computed test policy. Inserting the Q value computed in step 518 into EQN. 16 produces the desired yield and test policy.

The method 500 terminates at step 524.

Figure 6:
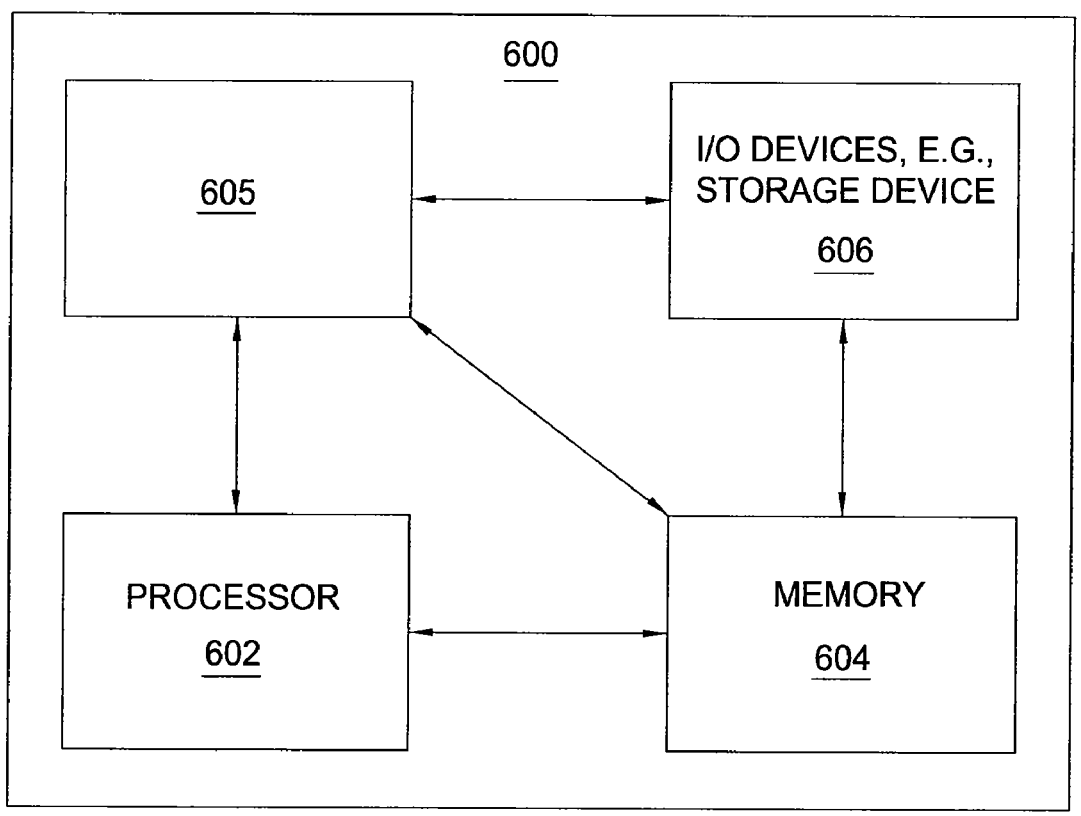
FIG. 6 is a high-level block diagram of the test margin computation method that is implemented using a general purpose computing device.

FIG. 6 is a high-level block diagram of the test margin computation method that is implemented using a general purpose computing device 600. In one embodiment, a general purpose computing device 600 comprises a processor 602, a memory 604, a test margin computation module 605 and various input/output (I/O) devices 606 such as a display, a keyboard, a mouse, a stylus, a wireless network access card, and the like. In one embodiment, at least one I/O device is a storage device (e.g., a disk drive, an optical disk drive, a floppy disk drive). It should be understood that the test margin computation module 605 can be implemented as a physical device or subsystem that is coupled to a processor through a communication channel.

Alternatively, the test margin computation module 605 can be represented by one or more software applications (or even a combination of software and hardware, e.g., using Application Specific Integrated Circuits (ASIC)), where the software is loaded from a storage medium (e.g., I/O devices 606) and operated by the processor 602 in the memory 604 of the general purpose computing device 600. Thus, in one embodiment, the test margin computation module 605 for computing test margins for at-speed testing of integrated circuit chips, as described herein with reference to the preceding Figures can be stored on a computer readable storage medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for computing a margin for at-speed testing of a design for an integrated circuit chip, the method comprising:
   computing a statistical chip slack for the chip, wherein the chip slack is computed using statistical timing of the chip;
   computing a statistical test slack for the chip, wherein the test slack is computed using statistical timing of a tested portion of the chip; and
   computing the margin from the chip slack and the test slack, wherein computing the margin comprises: expressing the chip slack in terms of the test slack;
   calculating the margin such that when the test slack is greater than the margin, the chip slack is greater than zero with a required confidence; and
      maximizing a total fraction of chips put into circulation such that a number of bad chips put into circulation is less than or equal to a required quality level, wherein the margin represents a set of test slacks between zero and a number greater than zero, such that a number of chips falling within the margin include: a first set of chips for which the chip slack is less than zero and the test slack is lower than the number greater than zero and a second set of chips for which the chip slack is greater than zero and the test slack is lower than the number greater than zero, and wherein the first set of chips and the second set of chips are not put into circulation,
   wherein at least one of: said computing the statistical chip slack, said computing the statistical test slack, and said computing the margin is performed using a processor.

2. The method of claim 1, wherein the maximizing comprises:
   expressing the margin as a function of a performance-sensitive ring oscillator slack for the chip.

3. The method of claim 1, further comprising:
   computing at least one of: a test frequency, a yield, and a shipped product quality loss, based on the computed margin.

4. The method of claim 1, further comprising:
   computing the same margin for all chips to be tested.

5. The method of claim 1, wherein a separate margin is computed and applied to each clock domain of the chip.

6. The method of claim 1, further comprising:
   measuring a ring oscillator slack; and
   computing the margin individually for each chip to be tested, from the chip slack, the test slack, and the ring oscillator slack.

7. The method of claim 6, wherein the margin is applied on a tester by changing a clock period at which a chip for which the margin is computed is tested.

8. The method of claim 6, wherein the margin is applied on a tester by changing a power supply voltage at which a chip for which the margin is computed is tested.

9. The method of claim 1, further comprising:
   testing a chip manufactured according to the chip design using the margin.

10. A computer readable storage medium containing an executable program that, when executed by a processor, causes the processor to perform a method for computing a margin for at-speed testing of a design for an integrated circuit chip, where the method comprises:
    computing a statistical chip slack for the chip, wherein the chip slack is computed using statistical timing of the chip;
    computing a statistical test slack for the chip, wherein the test slack is computed using statistical timing of a tested portion of the chip; and
    computing the margin from the chip slack and the test slack, wherein computing the margin comprises: expressing the chip slack in terms of the test slack;
    calculating the margin such that when the test slack is greater than the margin, the chip slack is greater than zero with a required confidence; and
       maximizing a total fraction of chips put into circulation such that a number of bad chips put into circulation is less than or equal to a required quality level wherein the margin represents a set of test slacks between zero and a number greater than zero, such that a number of chips falling within the margin include: a first set of chips for which the chip slack is less than zero and the test slack is lower than the number greater than zero and a second set of chips for which the chip slack is greater than zero and the test slack is lower than the number greater than zero, and wherein the first set of chips and the second set of chips are not put into circulation.

11. The computer readable storage medium of claim 10, wherein the maximizing comprises:
    expressing the margin as a function of a performance-sensitive ring oscillator slack for the chip.

12. The computer readable storage medium of claim 10, further comprising:
    computing at least one of: a test frequency, a yield, and a shipped product quality loss, based on the computed margin.

13. The computer readable storage medium of claim 10, further comprising:
    measuring a ring oscillator slack; and
    computing the margin individually for each chip to be tested, from the chip slack, the test slack, and the ring oscillator slack.

14. The computer readable storage medium of claim 13, wherein the margin is applied on a tester by changing a clock period at which a chip for which the margin is computed is tested.

15. The computer readable storage medium of claim 13, wherein the margin is applied on a tester by changing a power supply voltage at which a chip for which the margin is computed is tested.

16. The computer readable storage medium of claim 10, further comprising: testing a chip manufactured according to the chip design using the margin.

17. Apparatus for computing a margin for at-speed testing of a design for an integrated circuit chip, the apparatus comprising:

means for computing a statistical chip slack for the chip, wherein the chip slack is computed using statistical timing of the chip;

means for computing a statistical test slack for the chip, wherein the test slack is computed using statistical timing of a tested portion of the chip; and means for computing the margin from the chip slack and the test slack wherein the means for computing the margin comprises:

means for expressing the chip slack in terms of the test slack;

means for calculating the margin such that when the test slack is greater than the margin, the chip slack is greater than zero with a required confidence; and means for maximizing a total fraction of chips put into circulation such that a number of bad chips put into circulation is less than or equal to a required quality level, wherein the margin represents a set of test slacks between zero and a number greater than zero, such that a number of chips falling within the margin include: a first set of chips for which the chip slack is less than zero and the test slack is lower than the number greater than zero and a second set of chips for which the chip slack is greater than zero and the test slack is lower than the number greater than zero, and wherein the first set of chips and the second set of chips are not put into circulation, wherein at least one of: said means for computing the statistical chip slack, said means for computing the statistical test slack for the chip, and said means for computing the margin comprises a processor.

* * * * *